United States Patent
Takehara

(10) Patent No.: US 7,882,279 B2
(45) Date of Patent: Feb. 1, 2011

(54) BIDIRECTIONAL CONTROL CIRCUIT

(75) Inventor: Masaru Takehara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 132 days.

(21) Appl. No.: 12/382,867

(22) Filed: Mar. 25, 2009

(65) Prior Publication Data

US 2009/0327570 A1 Dec. 31, 2009

(30) Foreign Application Priority Data

Jun. 26, 2008 (JP) ............................. 2008-167528

(51) Int. Cl.
*G06F 13/10* (2006.01)
*G06F 13/38* (2006.01)

(52) U.S. Cl. ........................ 710/31; 710/110
(58) Field of Classification Search ................... 710/31, 710/105–106, 110, 305, 316–317; 713/600; 365/193, 189.18; 326/62, 63, 80, 82, 86
See application file for complete search history.

(56) References Cited

U.S. PATENT DOCUMENTS

| | | | | |
|---|---|---|---|---|
| 4,283,760 A * | 8/1981 | Kita et al. | ...................... | 710/31 |
| 5,214,330 A * | 5/1993 | Okazaki | ...................... | 326/90 |
| 5,418,933 A * | 5/1995 | Kimura et al. | ............... | 713/600 |
| 5,736,870 A * | 4/1998 | Greason et al. | ................ | 326/86 |
| 5,923,186 A * | 7/1999 | Suggs | ......................... | 326/82 |
| 6,834,318 B2 * | 12/2004 | Hunter et al. | ................ | 710/110 |
| 6,909,307 B2 * | 6/2005 | Mitarashi | ....................... | 326/56 |
| 7,205,793 B2 * | 4/2007 | George | ........................ | 326/86 |
| 7,340,541 B2 * | 3/2008 | Castro et al. | ................... | 710/31 |
| 7,417,464 B2 * | 8/2008 | Crawford | ....................... | 326/89 |
| 7,478,286 B2 * | 1/2009 | Humphrey et al. | ............. | 714/43 |
| 7,508,723 B2 * | 3/2009 | Goodwin et al. | ............. | 365/193 |
| 2006/0242348 A1 * | 10/2006 | Humphrey et al. | ........... | 710/305 |

FOREIGN PATENT DOCUMENTS

JP 57-071034 5/1982
JP 63-093220 4/1988

* cited by examiner

*Primary Examiner*—Mark Rinehart
*Assistant Examiner*—Trisha Vu
(74) *Attorney, Agent, or Firm*—Staas & Halsey LLP

(57) ABSTRACT

A bidirectional bus control circuit to which first and second direction signals instructing bus directions are input and which inputs and outputs a clock signal and data signal includes a first bidirectional buffer that switches an input or output direction of the clock signal in accordance with the second direction signal, a second bidirectional buffer that switches an input or output direction of the data signal in accordance with the second direction signal, and a data confirmation unit that confirms a data signal input to the second bidirectional buffer and invalidates the confirmation of the data signal in accordance with switching of the signal direction instructed by the first direction signal from the input direction to the output direction, the switching of the signal direction instructed by the first direction signal occurring before the switching of the signal direction instructed by the second direction.

10 Claims, 6 Drawing Sheets

BIDIRECTIONAL CONTROL CIRCUIT

CROSS-REFERENCE TO RELATED APPLICATION

This application is based upon and claims the benefit of priority of the prior Japanese Patent Application No. 2008-167528, filed on Jun. 26, 2008, the entire contents of which are incorporated herein by reference.

FIELD

The present invention relates to a semiconductor integrated circuit.

BACKGROUND

In recent years, application specific integrated circuits (ASIC) and other semiconductor integrated circuits have become increasingly complex and smaller in size. Signals of different types of clocks are being sent and received between the semiconductor integrated circuits (below, "IC"). Further, the bidirectional buses employed for sending and receiving signals between ICs switch the bus direction to the output or input direction at the time of sending or receiving signals, so the sending side and receiving side ICs have to constantly recognize the bus direction.

Using FIG. 5, the configuration of a conventional bidirectional bus will be explained. A master side IC instructing the bus direction sends a direction signal instructing the input direction or output direction to the slave side IC whereby the direction of the bidirectional bus is recognized between the two ICs. Further, the bus for transmitting the direction signal is duplexed to avoid errors from occurring in the recognition of the bus direction between the two ICs when the direction signal is clipped (bus fight).

Using FIG. 6, a flow chart of the signals sent between conventional bidirectional buses will be explained. In the past, a slave IC connected to a master IC instructing a bus direction and receiving a direction signal sent from the master IC confirms data without an input clock and input data for a predetermined time after the bus direction for the clock signal and data signal switches from the output direction to the input direction, so mistaken recognition of data and abnormal data accompanying it occur. For this reason, the conventional slave IC, as illustrated in FIG. 5, is provided with a signal suppression circuit for suppressing an error check for abnormal data occurring when the bus direction of the IC is switched from the output direction to the input direction, a time monitoring circuit for starting the error check after a certain time, etc.

Note that a circuit has been proposed for controlling the sending side and receiving side systems so that the directions of the bidirectional buffers do not become the same. In the proposed art, to prevent the directions of the bidirectional buffers of the sending side and receiving side systems from becoming the same, a control circuit for switching the directions of the bidirectional buffers is used to switch the receiving side bidirectional buffer before the sending side bidirectional buffer to a direction with its back to the sending side bidirectional buffer at the time of sending a data signal.

Japanese Laid-open Patent Publications No. S63-093220 and S57-071034 are known.

SUMMARY

According to an aspect of the invention, a directional bus control circuit to which first and second direction signals instructing bus directions are input and which inputs and outputs a clock signal and data signal, the bidirectional bus control circuit comprising: a first bidirectional buffer that switches an input or output direction of the clock signal in accordance with a signal direction instructed by the second direction signal; a second bidirectional buffer that switches an input or output direction of the data signal in accordance with a signal direction instructed by the second direction signal; and a data confirmation unit that confirms a data signal input to the second bidirectional buffer and invalidates the confirmation of the data signal in accordance with switching of the signal direction instructed by the first direction signal from the input direction to the output direction, the switching of the signal direction instructed by the first direction signal from the input direction to the output direction occurring before the switching of the signal direction instructed by the second direction signal from the input direction to the output direction.

Additional objects and advantageous of the invention (embodiment) will be set forth in part in the description which follows, and in part will be obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF DRAWINGS

These and other objects and features of the present invention will become clearer from the following description of the preferred embodiments given with reference to the attached drawings, wherein.

DESCRIPTION OF EMBODIMENTS

While the control circuits proposed in the above art can avoid mistaken recognition of the bus direction, they cannot avoid mistaken recognition of the data caused at the time of switching the bus direction. The present invention prevents mistaken operation by recognizing an invalid period of data recognition at the time of switching directions of the bidirectional bus.

A bidirectional bus control circuit operates to invalidate the confirmation operation of the data signal after the signal direction instructed by a first direction signal is switched from the input direction to output direction. After the confirmation operation is invalidated, the clock signal synchronized with the switching of the second direction signal becomes invalid, so it is possible to avoid mistaken recognition of the data.

Figure 1:
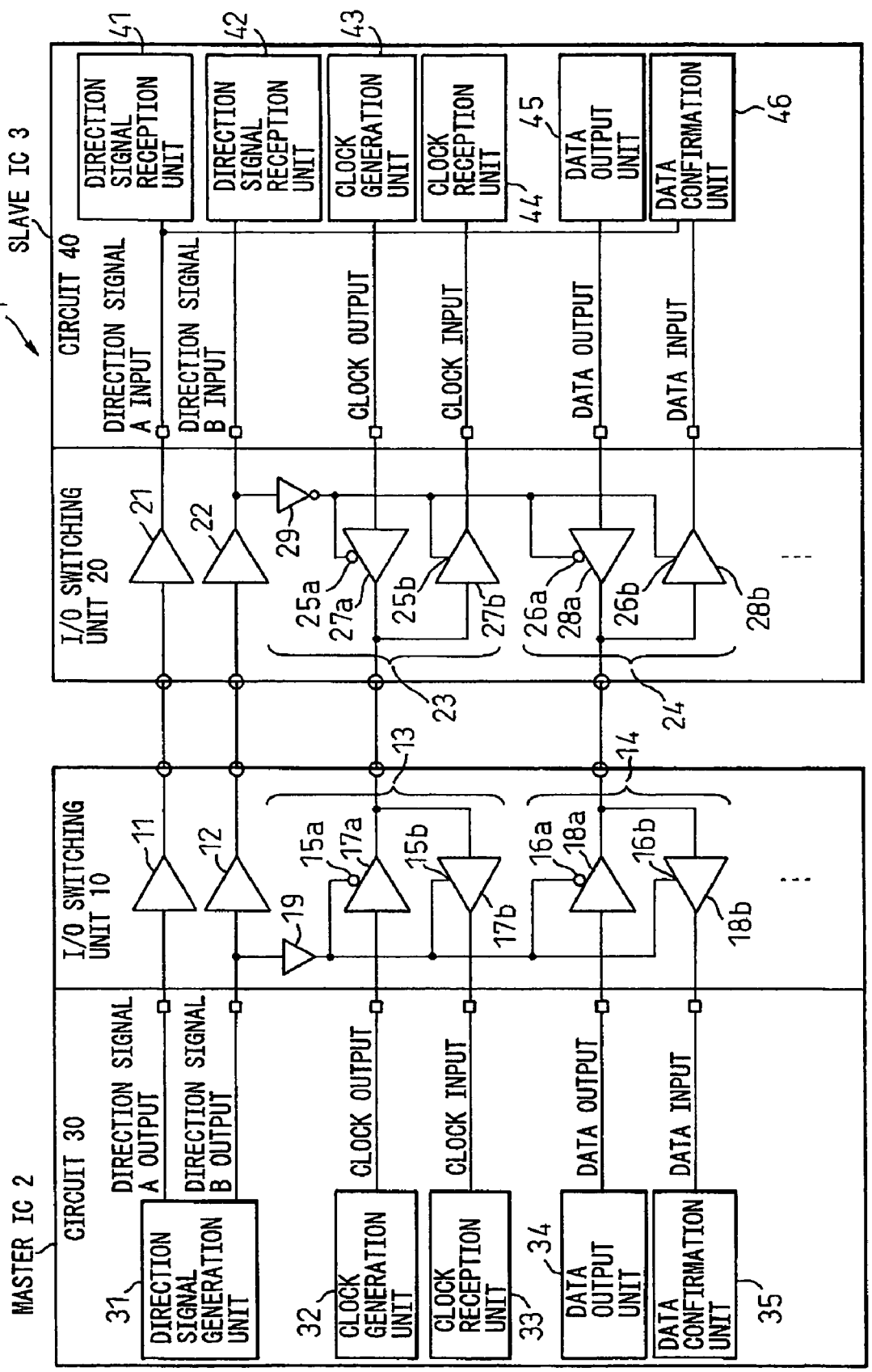
FIG. 1 is a view explaining an example of a system IC 1.

Below, an embodiment of the present invention will be explained with reference to the drawings. Using FIG. 1, an example of the configuration of the system IC 1 according to the present embodiment will be explained. The system IC 1 has a master IC 2 and a slave IC 3. The master IC 2 and the slave IC 3 are connected through a bus.

The master IC 2 is a master IC outputting a direction signal instructing the direction of the bidirectional bus to the slave IC 3. In the present embodiment, the master IC 2 outputs the direction signal A and the direction signal B, that is, the two types of direction signals, to the slave IC 3. The master IC 2 has an I/O switching unit 10 functioning as a bidirectional bus control circuit and a control circuit 30. The I/O switching unit 10 is provided with a first output buffer 11 outputting a direction signal A, a second output buffer 12 outputting a direction signal B, a clock use bidirectional buffer 13 to which clock signal is input or output, and a data use bidirectional buffer 14 to which a data signal is input or output.

The clock use bidirectional buffer 13 has a clock output buffer 17a and a clock input buffer 17b. The clock output buffer 17a receives a clock signal generated by the clock generation unit 32 and outputs the clock signal through the bus to the slave IC 3. Further, the clock input buffer 17b receives a clock signal sent from the slave IC 3 and outputs it to the clock reception unit 33. To the enable terminal 15a of the clock output buffer 17a and the enable terminal 15b of the clock input buffer 17b, the direction signal B is input through the buffer 19 for making these buffers valid or invalid and controlling input/output of the buffer signal. In the same way, the data use bidirectional buffer 14 has a data output buffer 18a and data input buffer 18b. The data output buffer 18a receives data output by the data output unit 34 and outputs the received data toward the slave IC 3. Further, the data input buffer 18b receives the data sent by the slave IC 3 and outputs the received data toward the data confirmation unit 35. To the enable terminal 16a of the data output buffer 18a and the enable terminal 16b of the data input buffer 18b, the direction signal B is input through the buffer 19 for making these buffers valid or invalid and controlling the input/output of the buffer signal.

The control circuit 30 has a direction signal generation unit 31, clock generation unit 32, clock reception unit 33, data output unit 34, and data confirmation unit 35. The direction signal generation unit 31 generates the direction signal A and the direction signal B and outputs the direction signal A to the first output buffer 11 and the direction signal B to the second output buffer 12. The clock generation unit 32 generates a clock signal and outputs it to the clock use output buffer 17a. The clock reception unit 33 receives the clock signal input to the clock use input buffer 17b. The data output unit 34 outputs the data to the data output buffer 18a. The data confirmation unit 35 receives the data input to the data use input buffer 18b and performs processing for confirming the received data. Note that the data confirmation unit 35 performs data confirmation processing including a parity check for the input data from the slave IC 3 input to the data use input buffer 18b and/or an error check using an ECC (Error-Correcting Code).

The slave IC 3 is a slave IC receiving a direction signal sent by the master IC 2. The slave IC 3 has an I/O switching unit 20 functioning as a bidirectional bus control circuit and a control circuit 40. The I/O switching unit 20 is provided with a first input buffer 21 to which the direction signal A received from the master IC 2 is input, a second input buffer 22 to which a direction signal B received from the master IC 2 is input, a clock use bidirectional buffer 23 which a clock signal is input to or output from, and a data use bidirectional buffer 24 which data signal is input to or output from.

The clock use bidirectional buffer 23 has a clock output buffer 27a and clock input buffer 27b. The clock output buffer 27a receives a clock signal generated by the clock generation unit 43 and outputs it to the master IC 2. The clock input buffer 27b receives the clock signal output by the master IC 2 and outputs it toward the clock reception unit 44. To the enable terminal 25a of the clock output buffer 27a and the enable terminal 25b of the clock input buffer 27b, the direction signal B is input through the second input buffer 22 and buffer 29 so as to make the buffers valid or invalid and control input/output of the buffer signal. Similarly, the data use bidirectional buffer 24 has a data output buffer 28a and data input buffer 28b. The data output buffer 28a receives data output by the data output unit 45 and outputs it toward the master IC 2. The data input buffer 28b receives data sent by the master IC 2 and outputs it toward the data confirmation unit 46. To the enable terminal 26a of the data output buffer 28a and the enable terminal 26b of the data input buffer 28b, the direction signal B is input through the second input buffer 22 and buffer 29 to make the buffers valid or invalid and control input/output of the buffer signal.

The control circuit 40 has a direction signal A reception unit 41, direction signal B reception unit 42, clock generation unit 43, clock reception unit 44, data output unit 45, and data confirmation unit 46. The direction signal A reception unit 41 receives the direction signal A received from the master IC 2 through the first input buffer 21. The direction signal B reception unit 42 receives the direction signal B received from the master IC 2 through the second input buffer 22. The clock generation unit 43 generates a clock signal and outputs it to the clock use output buffer 27a. The clock reception unit 44 receives the clock signal sent by the master IC 2 input to the clock use input buffer 27b. The data output unit 45 outputs data to the data output buffer 28a. The data confirmation unit 46 performs confirmation processing on the data from the master IC 2 input to the data use input buffer 28b. The direction signal A received at the first input buffer 21 is sent to the data confirmation unit 46 and utilized at the data confirmation unit 46 (explained later). Note that the data confirmation unit 46 performs data confirmation including a parity check on the input data from the master IC 2 and/or an error check using an ECC. Here, the buffers in the I/O switching unit 10 of the master IC 2 are connected by buses to the buffers in the I/O switching unit 20 of the slave IC 3.

Note that while not illustrated, the master IC 2 and slave IC 3 can be provided with boards and semiconductor transistors, diodes, resistors, and other devices and their interconnects on the boards so as to perform the directional bus control functions and other various specific functions.

Figure 2:
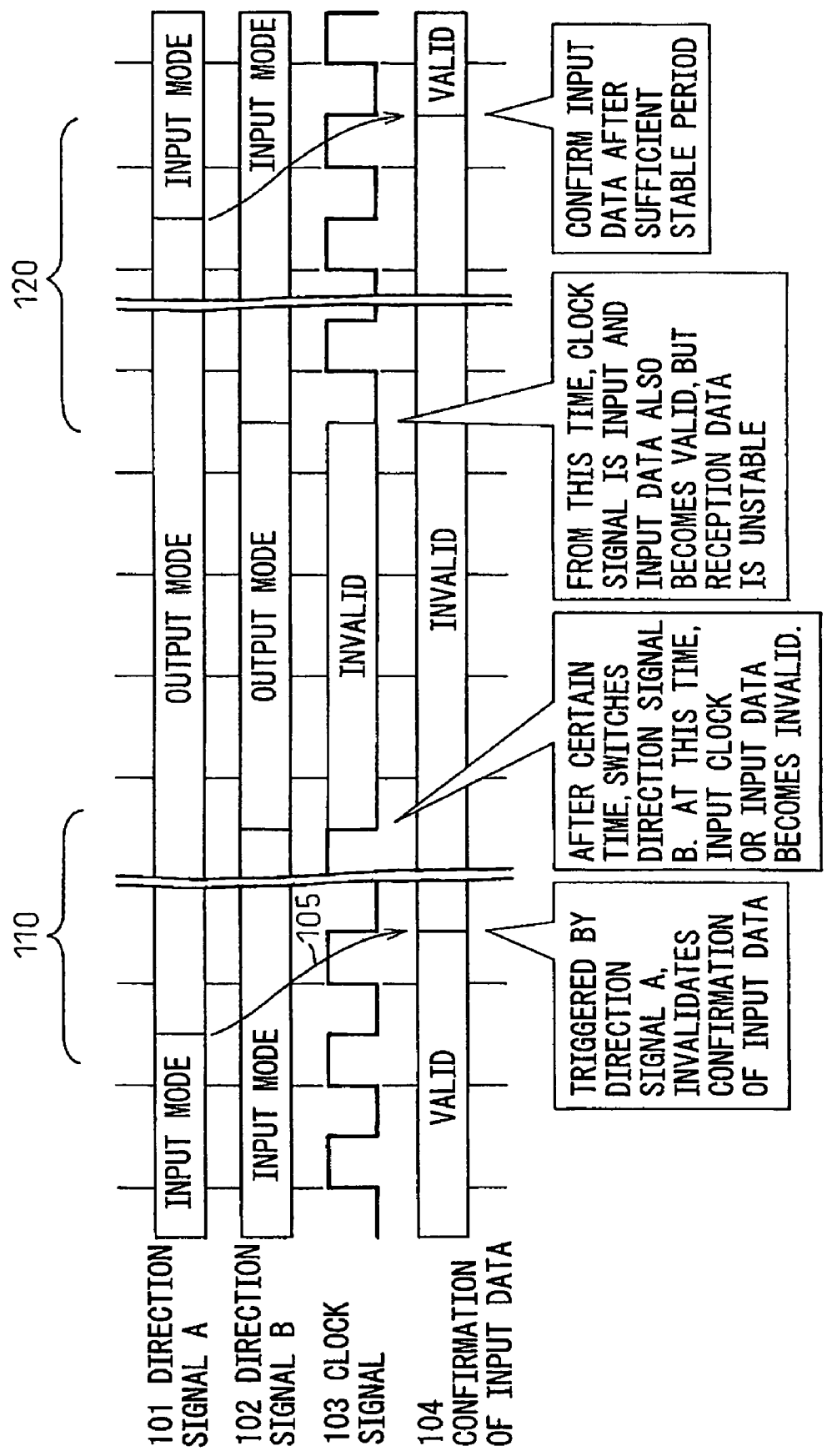
FIG. 2 is a time chart of an example of processing of signals and input data received by the slave IC.

Using FIG. 2, an example of a time chart of processing of signals and input data transmitted by the master IC and received by the slave IC will be illustrated. In the time charts 101 and 102, the direction signals A and B are used to indicate whether the signal direction of the clock signal (below, called the "master clock signal") and data signal output from the master IC to the slave IC is input or output. That is, a direction signal of the "input mode" illustrates a state where the slave IC receives as input the master clock signal and data signal sent from the master IC. A direction signal of the "output mode" illustrates a state where the clock signal and data signal are output from the slave IC to the master IC. At the time chart 103, the state of the master clock signal is illustrated. That is, when the direction signal B is the "input mode", the slave IC confirms a data signal output from the master IC by detecting a master clock signal generated by the clock generation unit 32 and output from the master IC. Further, when the direction signal B is the "output mode", there is no data output from the master IC to the slave IC and the master clock signal is unnecessary, so the input master clock signal is made invalid. At the time chart 104, the state of the data signal confirmed by the slave IC in accordance with the direction signal A is illustrated. That is, when the direction signal A is the "input mode", the slave IC makes the confirmation of the data signal output from the master IC "valid". Further, when the direction signal A is the "output mode", there is no data output from the master IC to the slave IC and the slave IC outputs a data signal to the master IC, so makes the input data signal "invalid". The master IC 2 generates the direction signal A and the direction signal B so that the switching of the signal direction instructed to the slave IC 3 by the direction signal A (added since clear indication of the destination of instruction is necessary) from the input direction to the output direction occurs before switching of the signal direction instructed to the slave IC 3 by the direction signal B from the input direction to the output direction. The switching time 110 illustrates the time interval between the start of switching of the direction signal A from the input mode to the output mode and the end of the switching of the direction signal B from the input mode to the output mode. The switching time 110 is preferably made the time interval required for switching the confirmation processing of the input data from "valid" to "invalid". To set the switching time 110, the direction signal generation unit 31 of the master IC 2 generates the direction signals A and B so as to switch the signal direction instructed by the direction signal A from the "input mode" to the "output mode", then, after a predetermined time interval, switch the signal direction instructed by the direction signal B from the "input mode" to the "output mode".

In this way, in the present embodiment, rather than sending to the slave IC two direction signals instructing a mode change to the slave IC at the same timing, the two direction signal A and direction signal B having different mode change timings are sent to the slave IC.

At the switching time 110, the slave IC 3 utilizes the direction signal A as a preannouncement signal preannouncing the "switching of the data signal and clock signal" and utilizes the direction signal B as a signal actually switching the bidirectional buffers of the data signal and clock signal.

As illustrated by the arrow mark 105 and time chart 104, the data confirmation unit 46 of the slave IC 3 is triggered by the change of the direction signal A received from the master IC 2 from the input mode to the output mode and changes the confirmation processing of the input data from valid to invalid.

Further, the master IC 2 changes the mode of the direction signal B from the input mode to the output mode after stopping the confirmation processing by the data confirmation unit 46. Note that due to the transmission delay of the direction signal A and the time required for processing for stopping the data confirmation unit 46, a time lag occurs in the time between the switching of the direction signal A and the stopping of the confirmation processing of input data by the data confirmation unit 46. Therefore, it is preferable to generate the direction signal B considering this time lag so that the direction is switched by the direction signal B after the confirmation processing reliably ends.

The direction signal B is directly connected to the enable terminals 25a and 25b of the clock use bidirectional buffer 23. By switching the direction signal B from the input mode (for example, "LOW" level) to the output mode (for example, "HIGH" level), the bus direction is inverted from the input direction to the output direction. In this case, the clock output buffer 27a becomes "valid" and the clock input buffer 27b becomes "invalid". Furthermore, as illustrated in the time chart 103, the master clock signal is made "invalid" by the switching of the direction signal B from the "input mode" to the "output mode". In this way, the master clock signal received by the slave IC becomes invalid synchronously with the switching of the direction signal B. Note that while not illustrated in the chart of FIG. 2, the direction signal B is directly connected to the enable terminals 26a and 26b of the data use bidirectional buffer 24, so the bus direction inverts from the input direction to the output direction and the data signal input by the slave IC 3 becomes invalid.

In the above way, the slave IC of the present embodiment operates so as to end the confirmation operation of the input data signal by the data confirmation unit 46 after the direction signal A is switched from input to output and, further, after the end of the confirmation operation, makes the master clock signal invalid by switching the direction of the direction signal B from input to output. For this reason, in the present embodiment, it is possible to avoid mistaken recognition of the confirmation data due to clock instability etc. and possible to also prevent the generation of abnormal data accompanying this. For this reason, the slave IC can eliminate the need for the signal suppression circuit for the data at the time of switching the bus direction and the time monitoring circuit of the error check, while the master IC can switch the bus direction without considering the setting of the signal suppression/time monitoring circuit at the slave IC side.

At the time 120 of switching at the slave IC 3 from output to input illustrated at FIG. 2, the direction signal output from the master IC 2 is changed from the output mode to the input mode. Along with this, the data confirmation processing of the slave IC 3 changes from invalid to valid.

The master IC 2 generates the direction signals A and B so that the switching of the signal direction instructed by the direction signal A from the output direction to the input direction occurs after the switching of the signal direction instructed by the direction signal B from the output direction to the input direction. For this reason, at the switching time 120, after the switching of the signal direction instructed by the direction signal B from the output direction to the input direction, the signal direction instructed by the direction signal A is switched from the output direction to the input direction.

The switching time 120 illustrates the time interval between the start of switching of the direction signal B from the output mode to the input mode and the end of switching of the direction signal A from the output mode to the input mode. The switching time 120 is preferably made a time interval for securing a sufficiently stable period after switching the confirmation processing of the input data from "invalid" to "valid". To set the switching time 120, the direction signal generation unit 31 of the master IC 2 generates the direction signals A and B so as to switch the signal direction instructed by the direction signal B from the "output mode" to the "input mode", then, after a predetermined time interval, switch the signal direction instructed by the direction signal A from the "output mode" to the "input mode". At the switching time 120, the slave IC 3 can utilize the direction signal B as a signal for actually switching the bidirectional buffers of the data signal and clock signal and can utilize the direction signal A as a trigger signal for start of data recognition.

As illustrated in the time charts 102 and 103, the direction signal B is directly connected to the enable terminals 25a and 25b, so when the direction signal B is switched from the output mode (for example, "HIGH" level) to the input mode (for example, "LOW" level), the clock output buffer 27a becomes invalid and the clock input buffer 27b becomes valid. For this reason, as illustrated in the time chart 103, the input of the master clock signal becomes valid synchronously with the direction signal B. Note that while not illustrated in FIG. 2, the direction signal B is directly connected to the enable terminals 26a and 26b, so when the direction signal B is switched from the output mode to the input mode, the input of the data signal also becomes valid.

The direction signal A is changed from the output mode to the input mode after a period where the clock and bus data become sufficiently stable after a change of mode of the direction signal B by the direction signal generation unit 31 of the master IC 2. For this reason, the mode change timing of the direction signal B from output to input and the mode change timing of the direction signal A from output to input preferably can be set at the master IC side in accordance with the type of the clock signal. The data confirmation unit 27 is triggered by the change of the direction signal A from the output mode to the input mode and starts the confirmation processing of the input data.

In this way, the slave IC 3 can avoid confirmation processing during the unstable state of the clock signal and data signal occurring after input by starting the confirmation processing after the elapse of a certain time from the change of the input mode. Further, the confirmation processing of the data can be performed using a clock signal and data signal having stable waveforms, so it is possible to avoid mistaken recognition due to recognition of data based on an unstable waveform after change of the direction signal. For this reason, the slave IC can eliminate the need of the signal suppression circuit for data at the time of switching the bus direction and the time monitoring circuit of the error check even at the time of change of the signal direction from the input direction to the output direction, while the master IC can switch the bus direction without considering the setting of the signal suppression/time monitoring circuit at the slave IC side.

Figure 3:
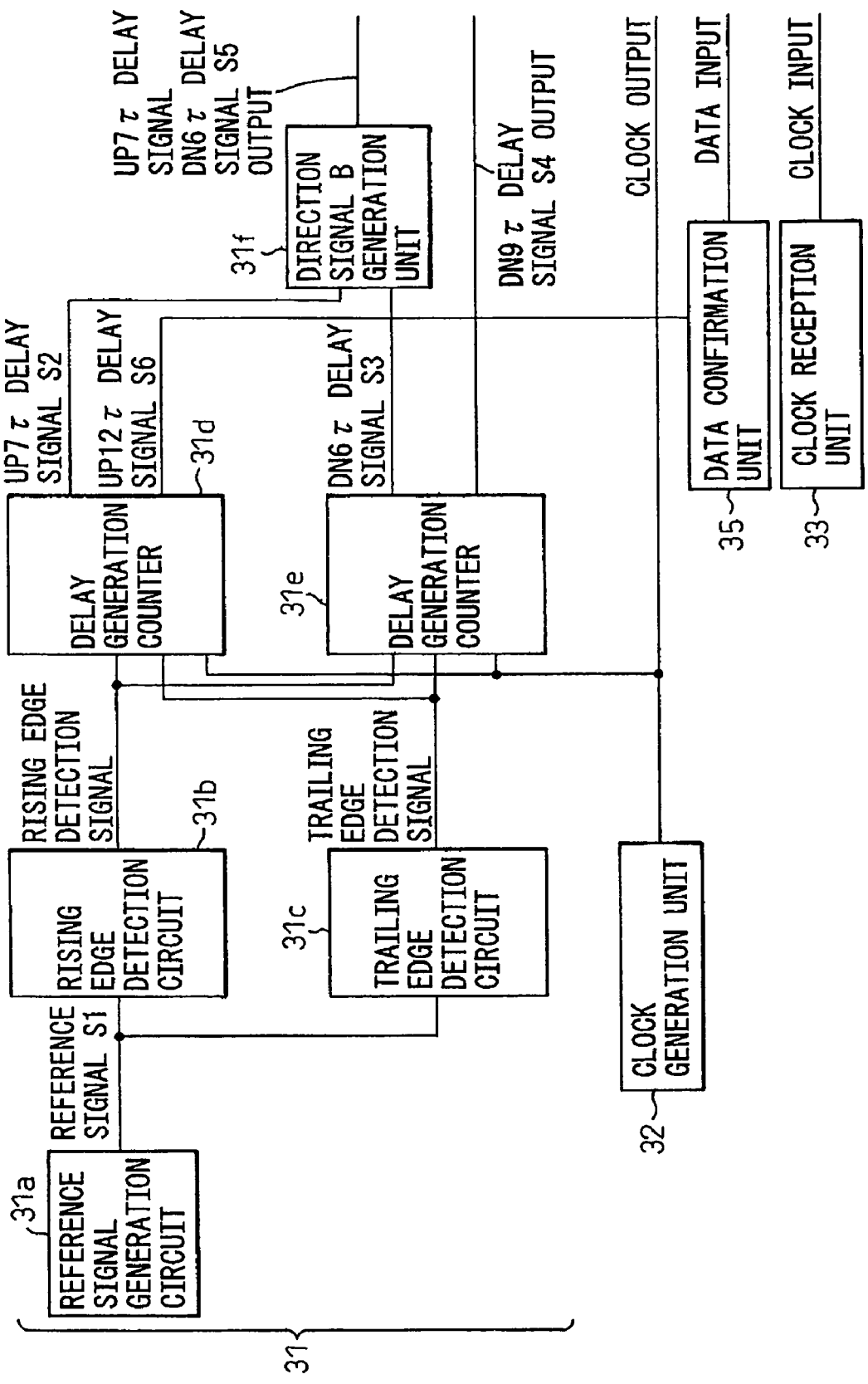
FIG. 3 is a view explaining an example of circuit blocks for generating direction signals.

Using FIG. 3, an example of the direction signal generation unit will be explained. In this example, the method of generation of the direction signals A and B by the direction signal generation unit will be explained. The direction signal generation unit 31 has a reference signal generation circuit 31a, rising edge detection circuit 31b, trailing edge detection circuit 31c, delay generation counter 31c, 31d, and direction signal B generation unit 31e.

The reference signal generation circuit 31a generates a reference signal S1. The reference signal S1 is a reference signal of the bus switching which changes when the master IC 2 switches a bus. For example, in the present embodiment, when the reference signal S1 is the LOW level, it illustrates that the master IC bus is the output direction or will become the output direction from now. Further, when the reference signal Si is the HIGH level, it illustrates that the master side bus is the input direction or will become the input direction from then. The rising edge detection circuit 31b detects the rising edge of the reference signal S1 and sends the rising edge detection signal to the delay generation counters 31d and 31e. Further, the trailing edge detection circuit 31c detects the trailing edge of the reference signal S1 and sends the trailing edge detection signal to the delay generation counters 31d and 31e.

The delay generation counter 31d is triggered by reception of the rising edge detection signal from the rising edge detection circuit 31b, starts countup of the clock pulses output from the clock generation unit 32, outputs HIGH after count start 7τT, and generates an UP7τ delay signal S2 falling to LOW simultaneously with the reception of the trailing edge detection signal. Furthermore, the delay generation counter 31d is triggered by reception of the rising edge detection signal from the rising edge detection circuit 31b, starts the countup of the clock pulses output from the clock generation unit 32, outputs HIGH after count start 12τ, and generates a UP12τ delay signal S6 falling to LOW simultaneously with reception of the trailing edge detection signal. The delay generation counter 31e is triggered by reception of the trailing edge detection signal from the trailing edge detection circuit 31b, starts the countup of the clock pulses output from the clock generation unit 32, outputs LOW after count start 6τ, and generates a DN6τ delay signal S3 becoming HIGH simultaneously with reception of the rising edge detection signal. Further, the delay generation counter 31e is triggered by reception of the trailing edge detection signal from the trailing edge detection circuit 31b, starts the countup of the clock pulses output from the clock generation unit 32, outputs LOW after count start 9τ, and generates a DN9τ delay signal S4 becoming HIGH simultaneously with the reception of the rising edge detection signal.

Further, the direction signal B generation unit 31f receives the UP7τ delay signal S2 and DN6τ delay signal S3 and executes agreement processing so that as to output an UP7τ delay signal DN6τ delay signal S5 which becomes HIGH after 7τ from the count start of the starting point generation counter 31d by the rising edge of S2, that is, the rising edge detection signal, and becomes LOW after 6τ from the count start of the delay generation counter 31e by the trailing edge of S3, that is, the trailing edge detection signal.

The DN9τ delay signal S4 generated by the delay generation counter 31e is output as the direction signal A to the slave IC 3. Further, the UP7τ delay signal DN6τ delay signal S5 generated by the direction signal B generation unit 31f is output as the direction signal B to the slave IC 3.

Figure 4:
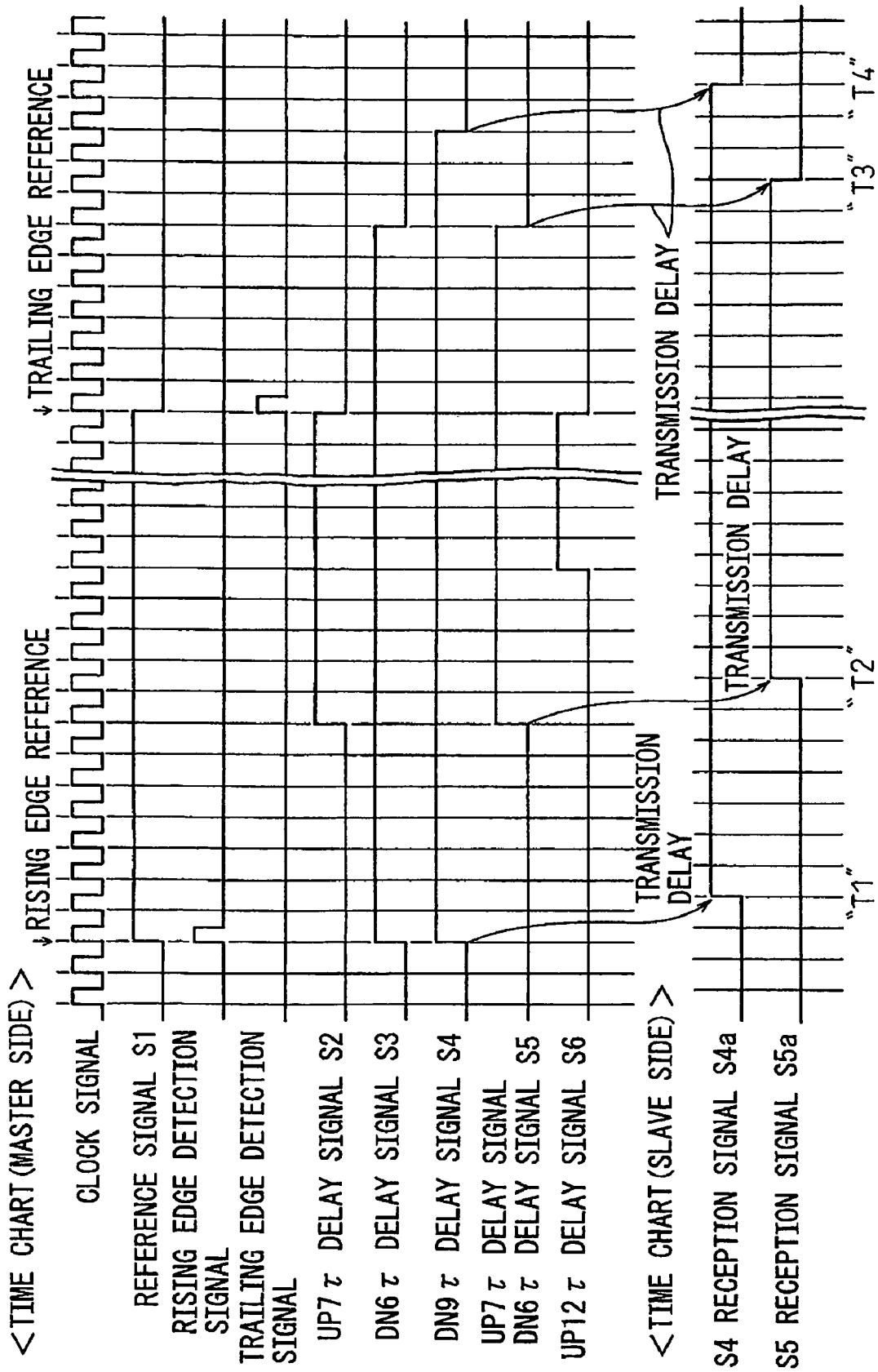
FIG. 4 is a view explaining an example of a time chart of direction signals.
Figure 5:
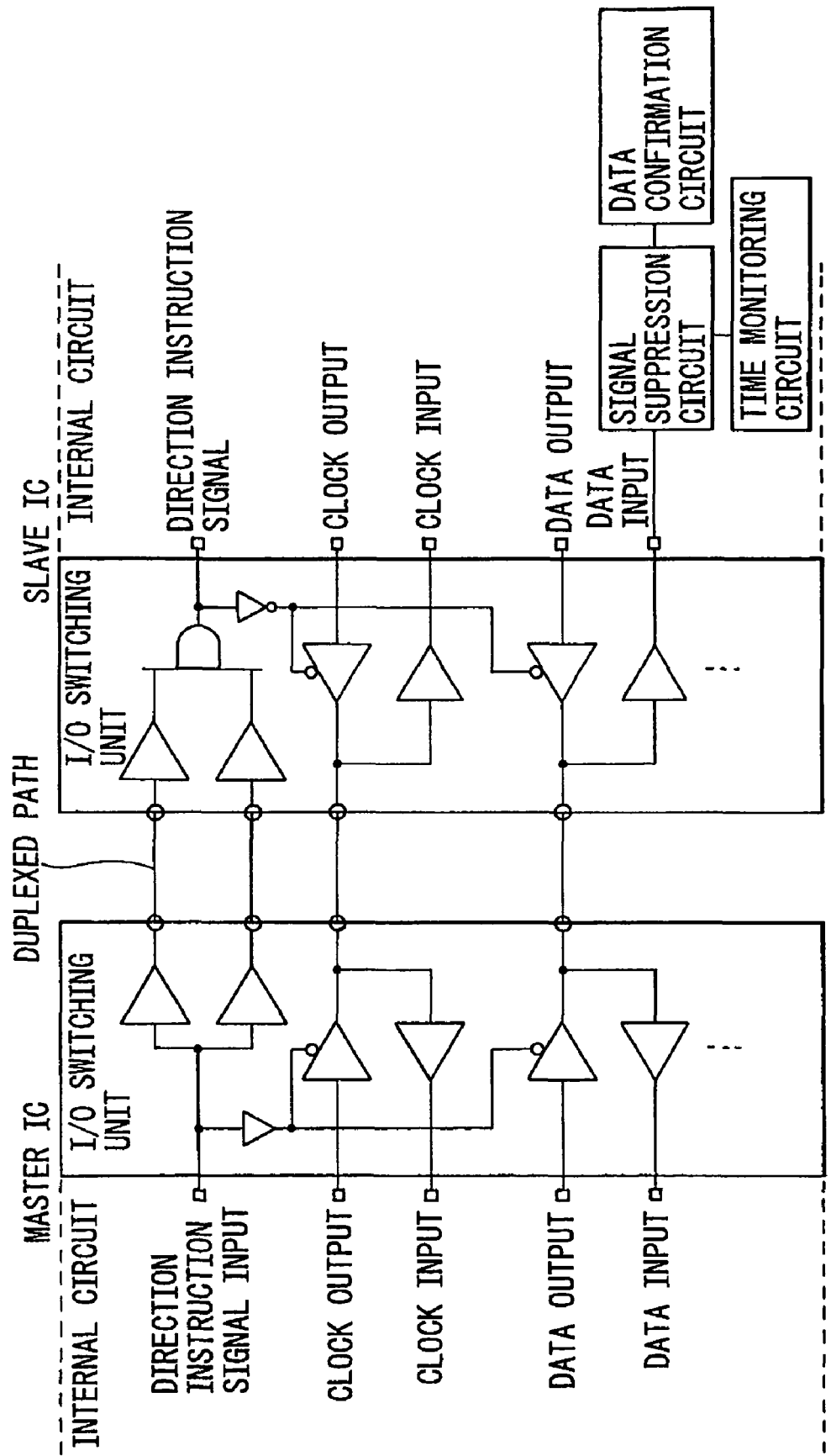
FIG. 5 is a view explaining I/O switching units of a conventional master IC and slave IC.
Figure 6:
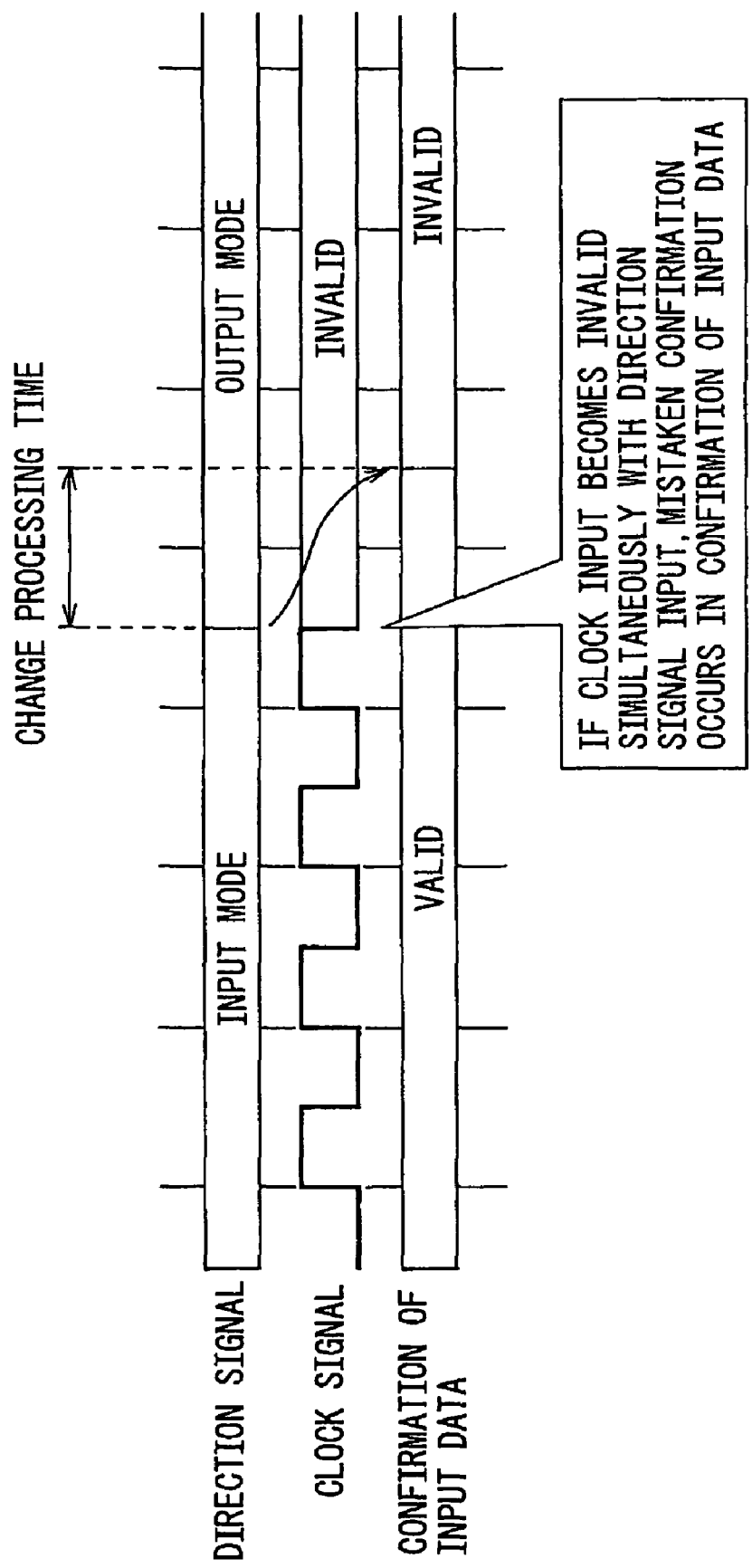
FIG. 6 is a time chart of an example of processing of signals and input data received by a conventional slave IC.

Using FIG. 4, an example of a signal chart generated by the direction signal generation unit will be explained. The slave IC 3 recognizes that the bus will switch from input to output at the timing Ti from the rising edge of the received signal S4a received from the master IC 2, that is, the direction signal A, and can invalidate recognition of the input data as explained using FIG. 2.

Next, the slave IC 3 inverts the direction of the clock use bidirectional bus 23 and data use bidirectional bus 24 from the input direction to the output direction at the timing T2 by the rising edge of the received signal S5a received by the master IC 2, that is, the direction signal B. During the period between this timings T1 and T2, preferably the confirmation processing of the data confirmation unit 46 of the slave IC 3 is switched to invalid. In the examples of FIG. 3 and FIG. 4, S5 rises after a delay of 7τ from the rising edge of the S4, but when more than 7τ of time is required for switching the confirmation processing at the slave IC to invalid or when the invalid switching ends at less than 7τ, it is preferable to switch the timing of the rising edge of S5 to that illustrated in FIG. 4. Therefore, by resetting the delay count of the rising edge of the delay signal S5 from the rising edge of S4 to another count other than 7τ in accordance with the type of the clock etc., even when the clock specifications differ, it is possible to reliably invalidate the confirmation processing between the timings T1 and T2.

The master IC 2 switches reversely the directions of the clock and data use bidirectional buses 13 and 14 by the rising edge or trailing edge of the direction signal B, that is, delay signal S5. Further, from the timing T2, the mode where the slave IC 3 outputs data is switched to, so the data signal and clock signal are sent from the slave IC 3 to the master IC 2. The clock and data signals input from the slave IC 3 to the master IC 2 may become unstable right after bus switching. For this reason, the master IC 2 can use the delay signal S6 to monitor the data by the data monitoring unit 35 after the data and clock signals sent from the slave IC 3 become stable in state. For example, from the timing T2, the slave IC 3 starts transmitting data to the master IC 2, but the master IC 2 does not start confirmation processing by the data confirmation unit 35 when the delay signal S6 is in the LOW state. It starts the confirmation processing by the data confirmation unit 35 after the delay signal S6 becomes the HIGH state. Further, by resetting the delay count from the rising edge of S5 of the delay signal S6 at the delay generation counter 31d to another count in accordance with the type of the clock, even when the clock specifications differ, it is possible to generate a suitable delay signal S6 after the received signal becomes the stable state.

In this way, by having the master IC 2 start the confirmation processing by the data confirmation unit after the elapse of a certain time from after the change of the input mode, it is possible to avoid confirmation processing during the unstable state of the clock signal and data signal occurring after master input. Further, the data confirmation processing can be performed using the clock signal and data signal having stable waveforms, so it is possible to avoid mistaken recognition due to recognition of data based on an unstable waveform after change of the direction signal.

The slave IC 3 receives the delay signal S4 and the delay signal S5 from the master IC 2 and inverts the direction of the clock use bidirectional bus 23 and data use bidirectional bus 24 from the output direction to the input direction at the timing T3 where S5a falls by the received signal S5a. Due to this, the master IC 2 inputs the clock signal and data signal through the bus. Furthermore, the slave IC 3, at the timing T4, detects the trailing edge of the signal of the received signal S4a, then starts the confirmation processing of the data so can avoid confirmation processing during the unstable state of the clock signal and data signal occurring after bus switching.

Further, by setting the count 9 of the delay signal S4 and/or the count 6 of the delay signal S5 at the delay generation counter 31e in a variable manner, the time between the timings T3 and T4 can be changed. For this reason, the master IC side can set the count in accordance with the type of the clock signal etc. so that the timing of change from the output to input of the direction signal A comes after the stable state of the data signal.

All examples and conditional language recited herein after intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present inventions have been described in detail, it should be understood that the various changes, substitutions, and alterations could be made hereto without departing from the spirit and scope of the invention.

What is claimed is:

1. A bidirectional bus control circuit to which first and second direction signals instructing bus directions are input and which inputs and outputs a clock signal and data signal, the bidirectional bus control circuit comprising:
a first bidirectional buffer that switches an input or output direction of the clock signal in accordance with a signal direction instructed by the second direction signal;
a second bidirectional buffer that switches an input or output direction of the data signal in accordance with a signal direction instructed by the second direction signal; and
a data confirmation unit that confirms a data signal input to the second bidirectional buffer and invalidates the confirmation of the data signal in accordance with switching of the signal direction instructed by the first direction signal from the input direction to the output direction,
the switching of the signal direction instructed by the first direction signal from the input direction to the output direction occurring before the switching of the signal direction instructed by the second direction signal from the input direction to the output direction.

2. A bidirectional bus control circuit as set forth in claim 1, wherein switching of the signal direction instructed by the first direction signal from the output direction to the input direction occurs after switching of the signal direction instructed by the second direction signal from the output direction to the input direction, and
the data confirmation unit validates the confirmation of the data signal in accordance with the switching of the signal direction instructed by the first direction signal from the input direction to the output direction.

3. A bidirectional bus control circuit as set forth in claim 1, wherein the confirmation by the data confirmation unit includes a parity check and/or ECC (Error-Correcting Code).

4. A directional bus control circuit to which first and second direction signals instructing bus directions are input and which inputs and outputs a clock signal and data signal, the bidirectional bus control circuit comprising:
a first bidirectional buffer that switches an input or output direction of the clock signal in accordance with a signal direction instructed by the second direction signal;
a second bidirectional buffer that switches an input or output direction of the data signal in accordance with a signal direction instructed by the second direction signal; and
a data confirmation unit that validates the confirmation of the data signal in accordance with switching of the signal direction instructed by the first direction signal from the output direction to the input direction,
the switching of the signal direction instructed by the first direction signal from the output direction to the input direction occurring before the switching of the signal direction instructed by the second direction signal from the output direction to the input direction.

5. A system bidirectional bus control circuit including:
a first bidirectional bus control circuit that outputs first and second direction signals instructing bus directions and inputs and outputs a clock signal and data signal; and
a second bidirectional bus control circuit to which the first and second direction signals are input and inputs and outputs a clock signal and data signal, wherein
the first bidirectional bus control circuit has a direction signal generation unit that generates the first and second direction signals so that switching of a signal direction instructed by the first direction signal from an input direction to output direction occurs before switching of a signal direction instructed by the second direction signal from an input direction to output direction, and
the second bidirectional bus control circuit comprises:
a first bidirectional buffer that switches the input or output direction of the clock signal in accordance with a signal direction instructed by the second direction signal;
a second bidirectional buffer that switches the input or output direction of the data signal in accordance with a signal direction instructed by the second direction signal; and
a data confirmation unit that confirms a data signal input to the second bidirectional buffer and invalidates the confirmation of the data signal in accordance with switching of the signal direction instructed by the first direction signal from the input direction to the output direction.

6. A system bidirectional bus control circuit as set forth in claim 5, wherein the direction signal generation unit generates the first and second direction signals so that switching of the signal direction instructed by the first direction signal from the output direction to the input direction occurs after switching of the signal direction instructed by the second direction signal from the output direction to the input direction, and the data confirmation unit validates the confirmation of the data signal in accordance with the switching of the signal direction instructed by the first direction signal from the input direction to the output direction.

7. A bidirectional bus control circuit as set forth in claim 5, wherein the second bidirectional bus control circuit further has a clock generation unit generating a clock signal, and the direction signal generation unit generates delay signals obtained by counting the clock signal as the first and second direction signals.

8. A bidirectional bus control circuit as set forth in claim 7, wherein the second bidirectional bus control circuit further has a data monitoring unit monitoring data, and the direction signal generation unit validates the confirmation of the data confirmation unit of the bidirectional signal in accordance with the switching of the second signal bus control circuit in accordance with the delay signal obtained by counting the clock signal.

9. A semiconductor integrated circuit to which first and second direction signals instructing bus directions are input and which inputs and outputs a clock signal and data signal, the semiconductor integrated circuit comprising:

a first bidirectional buffer that switches an input or output direction of the clock signal in accordance with a signal direction instructed by the second direction signal;

a second bidirectional buffer that switches an input or output direction of the data signal in accordance with a signal direction instructed by the second direction signal; and a data confirmation unit that confirms a data signal input to the second bidirectional buffer and invalidates the confirmation of the data signal in accordance with switching of the signal direction instructed by the first direction signal from the input direction to the output direction;

the switching of the signal direction instructed by the first direction signal from the input direction to the output direction occurring before the switching of the signal direction instructed by the second direction signal from the input direction to the output direction.

10. A processing system comprising:

a first system that outputs first and second direction signals instructing bus directions and inputs and outputs a clock signal and data signal using a bidirectional bus; and, a second system to which the first and second direction signals are input and which inputs and outputs the clock signal and data signal using the bidirectional bus, the first system having a direction signal generation unit that generates the first and second direction signals so that switching of the signal direction instructed by the first direction signal from the input direction to the output direction occurs before the switching of the signal direction instructed by the second direction signal from the input direction to the output direction, a first bidirectional buffer that switches the input or output direction of the clock signal in accordance with the signal direction instructed by the second direction signal, and a second bidirectional buffer that switches the input or output direction of the data signal in accordance with the signal direction instructed by the second direction signal, and the second system having a third bidirectional buffer that switches the input or output direction of the clock signal in accordance with the signal direction instructed by the second direction signal, a fourth bidirectional buffer that switches the input or output direction of the data signal in accordance with the signal direction instructed by the second direction signal, and a data confirmation unit that confirms a data signal input to the fourth bidirectional buffer and invalidates the confirmation of the data signal in accordance with switching of the signal direction instructed by the first direction signal from the input direction to the output direction.

* * * * *